US011114181B1

(12) United States Patent
Wieduwilt et al.

(10) Patent No.: US 11,114,181 B1
(45) Date of Patent: Sep. 7, 2021

(54) MEMORY DEVICES WITH REDUNDANT MEMORY CELLS FOR REPLACING DEFECTIVE MEMORY CELLS, AND RELATED SYSTEMS AND METHODS

(71) Applicant: Micron Technology, Inc., Boise, ID (US)

(72) Inventors: Christopher G. Wieduwilt, Boise, ID (US); James S. Rehmeyer, Boise, ID (US); Seth A. Eichmeyer, Boise, ID (US); Kenji Yoshida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/983,757

(22) Filed: Aug. 3, 2020

(51) Int. Cl.
*G11C 29/00* (2006.01)
*G11C 29/44* (2006.01)

(52) U.S. Cl.
CPC .......... *G11C 29/789* (2013.01); *G11C 29/44* (2013.01); *G11C 29/76* (2013.01); *G11C 29/787* (2013.01)

(58) Field of Classification Search
CPC ..... G11C 29/789; G11C 29/787; G11C 29/76; G11C 29/44
See application file for complete search history.

(56) References Cited

U.S. PATENT DOCUMENTS

| 9,064,587 B2 | 6/2015 | Blodgett | |
|---|---|---|---|
| 2007/0038906 A1* | 2/2007 | Lakhani | G11C 29/76 |
| | | | 714/710 |
| 2019/0055895 A1* | 2/2019 | Morzano | G11C 29/787 |

OTHER PUBLICATIONS

Shaari et al., U.S. Appl. No. 16/782,949, filed Feb. 5, 2020, titled Microelectronic Device Testing, and Associated Methods, Devices, and Systems.
Wieduwilt et al., U.S. Appl. No. 16/693,126, filed Nov. 19, 2020, titled Memory Device With a Memory Repair Mechanism and Methods for Operating the Same.

* cited by examiner

*Primary Examiner* — Tri M Hoang
(74) *Attorney, Agent, or Firm* — TraskBritt

(57) ABSTRACT

Memory devices are disclosed. A memory device may include a memory array including a number of memory cells partitioned into a number of memory segments. Each of the number of memory segments may include a redundant memory-cell group configurable to be accessed instead of a defective memory-cell group of the memory segment. The memory device may also include a set of latches configurable to indicate that a redundant memory-cell group of a memory segment of the number of memory segments is to be accessed instead of a defective memory-cell group of the memory segment. The set of latches may include segment latches configurable to indicate the memory segment or a status of the set of latches. The set of latches may also include address latches configurable to indicate the defective memory-cell group within the memory segment. Related systems and methods are also disclosed.

24 Claims, 7 Drawing Sheets

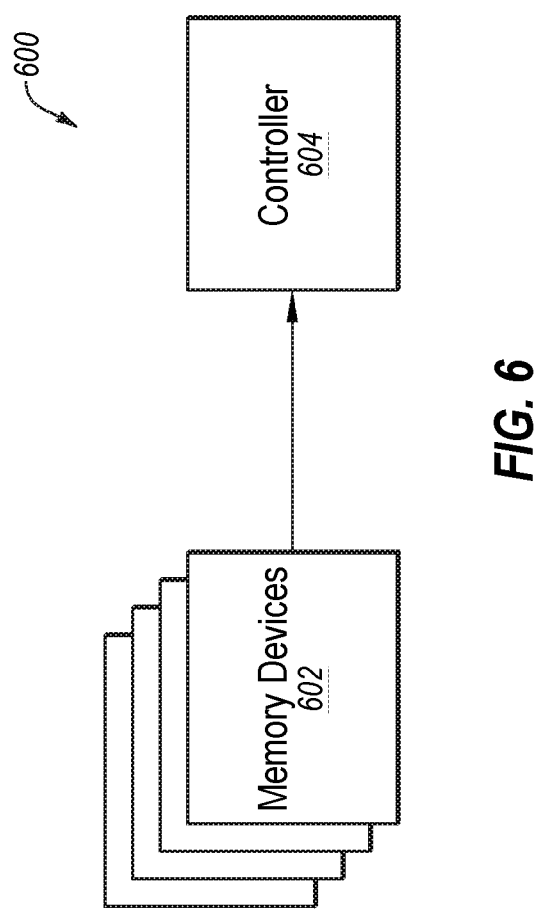

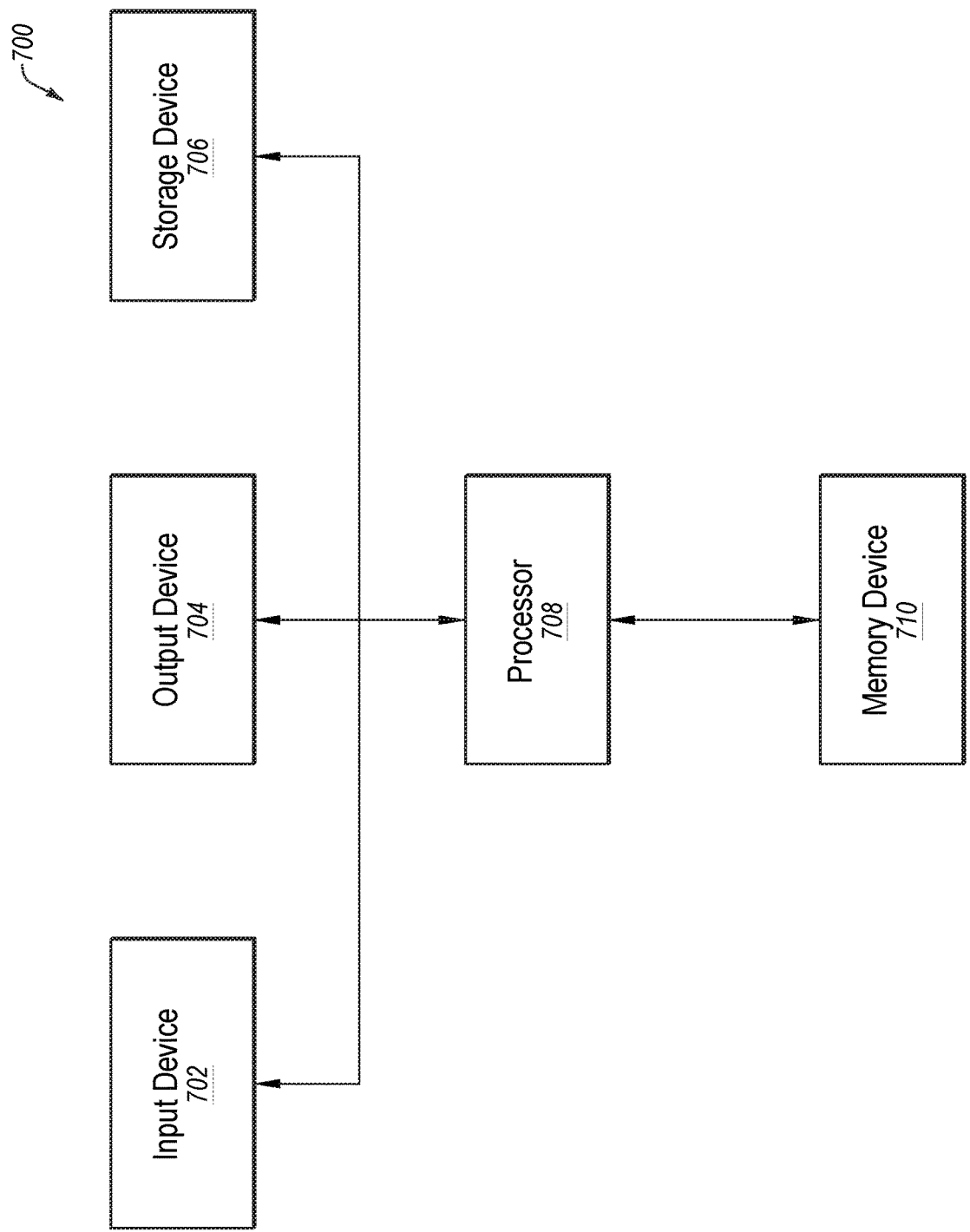

MEMORY DEVICES WITH REDUNDANT MEMORY CELLS FOR REPLACING DEFECTIVE MEMORY CELLS, AND RELATED SYSTEMS AND METHODS

CROSS-REFERENCE TO RELATED APPLICATIONS

This application is related to U.S. patent application Ser. No. 16/693,126, titled "MEMORY DEVICE WITH A MEMORY REPAIR MECHANISM AND METHODS FOR OPERATING THE SAME," filed Nov. 22, 2019, the entire disclosure of which is hereby incorporated by reference.

TECHNICAL FIELD

Embodiments of the disclosure relate to memory devices. More specifically, various embodiments relate to memory devices including redundant memory cells for replacing defective memory cells, and to related methods, devices, and systems.

BACKGROUND

A semiconductor memory device may include many (e.g., billions) of memory cells. In some cases, one or more of the memory cells may be defective. The semiconductor memory device may also include one or more redundant memory cells configured to be accessed instead of the one or more defective memory cells.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 6 is a simplified block diagram illustrating an example memory system, in accordance with various embodiments of the present disclosure.

FIG. 7 is a simplified block diagram illustrating an example electronic system, in accordance with various embodiments of the present disclosure.

DETAILED DESCRIPTION

Figure 1:
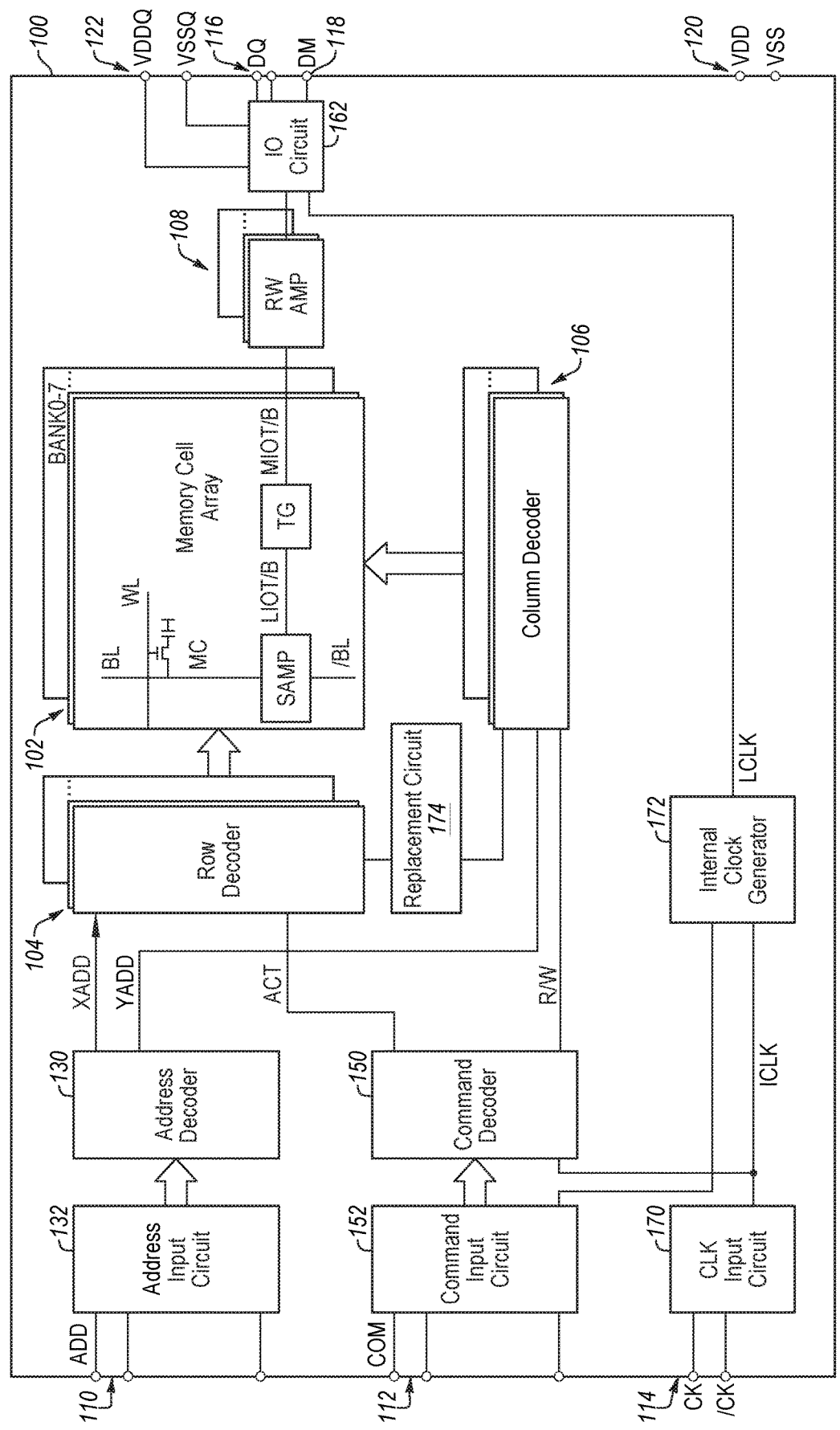
FIG. 1 is a functional block diagram illustrating an example memory device, in accordance with at least one embodiment of the present disclosure.

A semiconductor memory device typically includes an array of memory cells. Memory cells in the array may be selected for reading and writing by means of row and column address signals input to the memory device. The row and column address signals may be processed by address decoding circuitry to select row lines and column lines in the array to access the desired memory cell or memory cells.

When semiconductor memory devices are manufactured, defective memory cells may occur in the memory array or in a sub-array. To salvage or improve the semiconductor memory devices despite these defective memory cells, and thus to increase overall yield in the manufacturing process, redundant memory cells may be included in the semiconductor memory devices. Redundant memory cells may be located in the memory array. When a defective memory cell is identified in the memory array, redundant decoding circuitry associated with the redundant memory cells may be programmed (e.g., via fuse, antifuse, or other programming techniques) to respond to the address of the defective memory cell. For example, when the address of the defective memory cell is selected for access, the redundant decoding circuitry may provide the address of the redundant memory cell and the redundant memory cell may be accessed (e.g., read from or written to) rather than the defective memory cell. Additional description regarding memory devices including redundant decoding circuitry is included in U.S. patent application Ser. No. 16/693,126, titled "MEMORY DEVICE WITH A MEMORY REPAIR MECHANISM AND METHODS FOR OPERATING THE SAME."

As described more fully below, various embodiments disclosed herein relate to memory devices including redundant memory cells for replacing defective memory cells. More specifically, various embodiments relate to encoding and decoding associations between defective memory cells and redundant memory cells with fuses and/or latches.

In contrast to some conventional methods, systems, and devices for encoding and decoding associations between defective memory cells and redundant memory cells (i.e., that use an enable fuse and/or latch for each redundant memory cell group), various embodiments of the present disclosure may not require an enable fuse and/or latch. For example, various embodiments of the present disclosure may include segment latches and address latches, and one or more configurations of segment latches may indicate that an associated repair is not active (e.g., unused or decommissioned), thus obviating the need for enable fuses and/or latches. Additionally, because enable fuses and/or latches may not be required, logic (e.g., an XOR) associated with the enable fuses and/or latches may also not be required. Thus, in comparison to some conventional devices, systems, and methods, various embodiments of the present disclosure may reduce the total number of latches and/or fuses and/or reduce or simplify logic associated with the latches and/or fuses included in a memory device.

Reducing a number of latches, fuses, and/or logic gates may save space in a memory device which may represent an improvement in the memory device. For example, the saved space may result in an overall reduction in the size of the memory device. As another example, the saved space may be used for other circuits or memory cells which may improve the overall utility of the memory device. As another example, a reduction in the total number of latches, fuses and/or logic gates may result in power savings in operating the memory device, fewer chances for defects during manufacturing which may result in improved quality and/or yield, and fewer tests to be performed which may result in shorter testing times. In one specific, non-limiting example, various embodiments of the present disclosure may reduce the total number of latches of a memory device by approximately 8%.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory array 102.

In the embodiment of FIG. 1, the memory array 102 is shown as including eight memory banks BANK0-7. More or fewer banks may be included in the memory array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and/BL may be performed by a column decoder 106. In the embodiment of FIG. 1, the row decoder 104 may include a respective row decoder for each memory bank BANK0-7, and the column decoder 106 may include a respective column decoder for each memory bank BANK0-7.

The bit lines BL and/BL are coupled to a respective sense amplifier SAMP. Read data from the bit line BL or/BL may be amplified by the sense amplifier SAMP, and transferred to read/write amplifiers 108 over complementary local data lines (LIOT/B), a transfer gate (TG), and complementary main data lines (MIOT/B). Conversely, write data outputted from the read/write amplifiers 108 may be transferred to the sense amplifier SAMP over the complementary main data lines MIOT/B, the transfer gate TG, and the complementary local data lines LIOT/B, and written in the memory cell MC coupled to the bit line BL or/BL.

The memory device 100 may be generally configured to be receive various inputs (e.g., from an external controller) via various terminals, such as address terminals 110, command terminals 112, clock terminals 114, data terminals 116, and data mask terminals 118. The memory device 100 may include additional terminals such as a power supply terminal 120 and a power supply terminal 122.

During a contemplated operation, one or more command signals COM, received via the command terminals 112, may be conveyed to a command decoder 150 via a command input circuit 152. The command decoder 150 may include a circuit configured to generate various internal commands via decoding the one or more command signals COM. Examples of the internal commands include an active command ACT and a read/write signal R/W.

Further, one or more address signals ADD, received via the address terminals 110, may be conveyed to an address decoder 130 via an address input circuit 132. The address decoder 130 may be configured to supply a row address XADD to the row decoder 104 and a column address YADD to the column decoder 106. Although the command input circuit 152 and the address input circuit 132 are illustrated as separate circuits, in some embodiments, address signals and command signals may be received via a common circuit.

The active command ACT may include a pulse signal that is activated in response to a command signal COM indicating row access (e.g., an active command). In response to the active signal ACT, the row decoder 104 of a specified bank address may be activated. As a result, the word line WL specified by row address XADD may be selected and activated.

The read/write signal R/W may include a pulse signal that is activated in response to a command signal COM indicating column access (e.g., a read command or a write command). In response to the read/write signal R/W, the column decoder 106 may be activated, and the bit line BL specified by the column address YADD may be selected.

In response to the active command ACT, a read signal, a row address XADD, and a column address YADD, data may be read from the memory cell MC specified by the row address XADD and the column address YADD. The read data may be output via the sense amplifier SAMP, the transfer gate TG, the read/write amplifiers 108, an input/output circuit 162, and data terminals 116. Further, in response to the active command ACT, a write signal, a row address XADD, and a column address YADD, write data may be supplied to the memory array 102 via the data terminals 116, the input/output circuit 162, the read/write amplifiers 108, the transfer gate TG, and the sense amplifier SAMP. The write data may be written to the memory cell MC specified by the row address XADD and the column address YADD.

Clock signals CK and/CK may be received via clock terminals 114. A clock input circuit 170 may generate internal clock signals ICLK based on the clock signals CK and /CK. Internal clock signals ICLK may be conveyed to various components of the memory device 100, such as the command decoder 150 and an internal clock generator 172. The internal clock generator 172 may generate internal clock signals LCLK, which may be conveyed to the input/output circuit 162 (e.g., for controlling the operation timing of the input/output circuit 162). Further, the data mask terminals 118 may receive one or more data mask signals DM. When the data mask signal DM is activated, overwrite of corresponding data may be prohibited.

The memory device 100 may include a replacement circuit 174, which, in some embodiments, can be coupled to one or more address decoders, such as the address decoder 130, the row decoder 104, and/or the column decoder 106. In other embodiments, the replacement circuit 174, or parts thereof, may be included in one or more of the address decoder 130, the row decoder 104 and/or the column decoder 106. Additionally or alternatively, the address decoder 130, the row decoder 104 and/or the column decoder 106 may be configured to perform one or more operations described with regard to the replacement circuit 174. Additionally or alternatively, the address input circuit 132 may include one or more elements of the replacement circuit 174 and/or may be configured to perform one or more operations described with regard to the replacement circuit 174.

The replacement circuit 174 may be configured to repair defective memory cells of the memory array 102. For example, the replacement circuit 174 may be configured to replace a defective memory cell of the memory array 102 with a redundant memory cell of the memory array 102. More specifically, the replacement circuit 174 may be configured to cause the redundant memory cell to be accessed in response to an operation that includes an address of the defective memory cell (i.e., instead of the defective memory cell). In the present disclosure, the term "repair" may refer to causing a redundant memory cell (or a group of redundant memory cells) to be accessed instead of a defective memory cell (or a group of memory cells including one or more defective memory cells).

The replacement circuit 174 may include fuses, anti-fuses, and/or latch circuits configured to store replacement information (e.g., locations of defective memory cells, locations of redundant memory cells, and/or associations between redundant memory cells and defective memory cells). In some embodiments, the memory device 100 may include fuses in one location of the memory device 100 and may include one or more latch circuits located in other locations of the memory device 100. The latch circuits may include latches configured to latch states of the fuses. In the present disclosure, the term "latch" may be used to refer to a latch circuit.

The replacement circuit 174 may be configured to determine whether an operation address (e.g., a row address XADD and/or a column address YADD) associated with a command (e.g., ACT and/or R/W) addresses a defective memory cell for which a repair (e.g., a redundant memory cell) has been identified. The replacement circuit 174 may be configured to cause the memory device 100 (e.g., through the row decoder 104 and/or the column decoder 106) to access the redundant memory cell rather than the defective memory cell.

Figure 2:
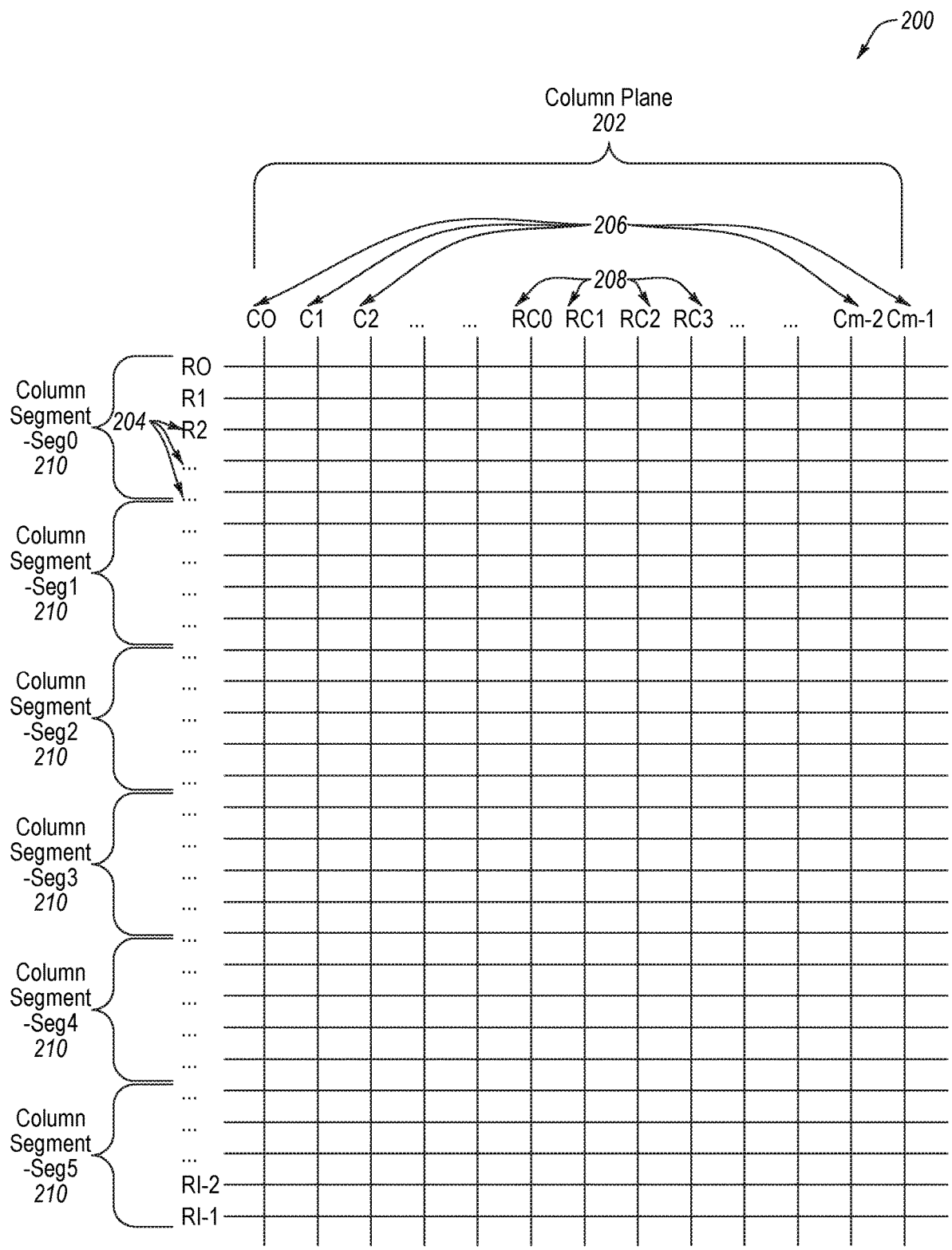
FIG. 2 is a diagram illustrating rows and columns of a memory array, in accordance with at least one embodiment of the present disclosure.

FIG. 2 is a diagram illustrating rows and columns of a memory array 200, in accordance with at least one embodiment of the present disclosure. The memory array 200 may be an example of a portion of a bank of the memory array 102 of FIG. 1. The memory array 200 may include memory cells (not illustrated in FIG. 2) at intersections between the rows and the columns of the memory array 200.

The memory array 200 includes a number (e.g., "l") of rows 204 designated, for descriptive purposes, as R0, R1, R2 . . . Rl-2, and Rl-1. The memory array 200 further includes a column plane 202. The column plane 202 includes a number (e.g., "m") of columns 206 designated, for descriptive purposes, as C0, C1, C2 . . . Cm-2, and Cm-1. Additionally, the column plane 202 includes a number of (e.g., 4) redundant columns 208 designated, for descriptive purposes, as RC0, RC1, RC2, and RC3. In FIG. 2, the memory array 200 is illustrated with a single column plane 202 for simplicity. However, a memory array of the present disclosure may include any number of column planes, each including columns and redundant columns. Additionally, although the column plane 202 is illustrated with 4 redundant columns 208, a column plane, as disclosed herein, may include any number of redundant columns. In some embodiments, the number of redundant columns may be based on a total number of columns in the column plane and/or an expected failure rate of memory cells of the column plane. Additionally or alternatively, although FIG. 2 illustrates the redundant columns 208 on the column plane 202, in some embodiments, the redundant columns 208 may be on a separate column plane. For example, the memory array 200 may include a redundant column plane including redundant columns corresponding to multiple column planes. Thus, although FIG. 2 illustrates what may be referred to in the art as a "local column repair scheme," embodiments of the present disclosure are not so limited. Embodiments of the present disclosure may also be applied in what may be referred to in the art as a "global repair scheme."

The columns 206 may be divided into column segments 210 designated, for descriptive purposes, as "Seg0"–"Seg5."

The column segments 210 may divide the columns into ranges of rows. As an example, there may be 6 column segments 210 that divide the columns into 6 segments of 1/6 rows. Although 6 column segments 210 are illustrated in FIG. 2, any number of column segments may be used. In some embodiments, as explained further below, it may be advantageous to select a number of column segments that is less than or equal to 2 to a power less 2 (e.g., $2^n-2$).

Segmenting the columns 206 may allow for replacement of a column segment rather than replacement of a single memory cell or conversely an entire column of memory cells. For example, if a defective memory cell is discovered in column C1, in Seg0 (e.g., between rows R0 and Rl/6-1), the corresponding column segment (C1, Seg0) may be replaced by a redundant column (e.g., RC0, Seg0). Thus, the total number of possible repairs for a column plane may be equal to the number of redundant columns in the column plane multiplied by the number of segments.

In the present disclosure, repairs are described with regard to columns 206 and column segments 210. This is not meant to be limiting. Rather, the principles of the present disclosure may apply equally to repairs implemented with regard to rows 204 and row segments (not illustrated in FIG. 2). For example, a memory array may include redundant rows (not illustrated in FIG. 2) configured to replace rows including defective memory cells. Additionally, the rows may be divided into row segments. Thus, in the present disclosure, the term "memory segment" may refer to a row segment or a column segment. Additionally, in the present disclosure, references to locating, identifying, or indicating defects or defective memory cells within a memory segment may refer to identifying a column (e.g., C0-Cm-1) of a column segment that includes one or more defective memory cells or a row (e.g., R0-Rl-1) of a row segment that includes one or more defective memory cells.

Figure 3:
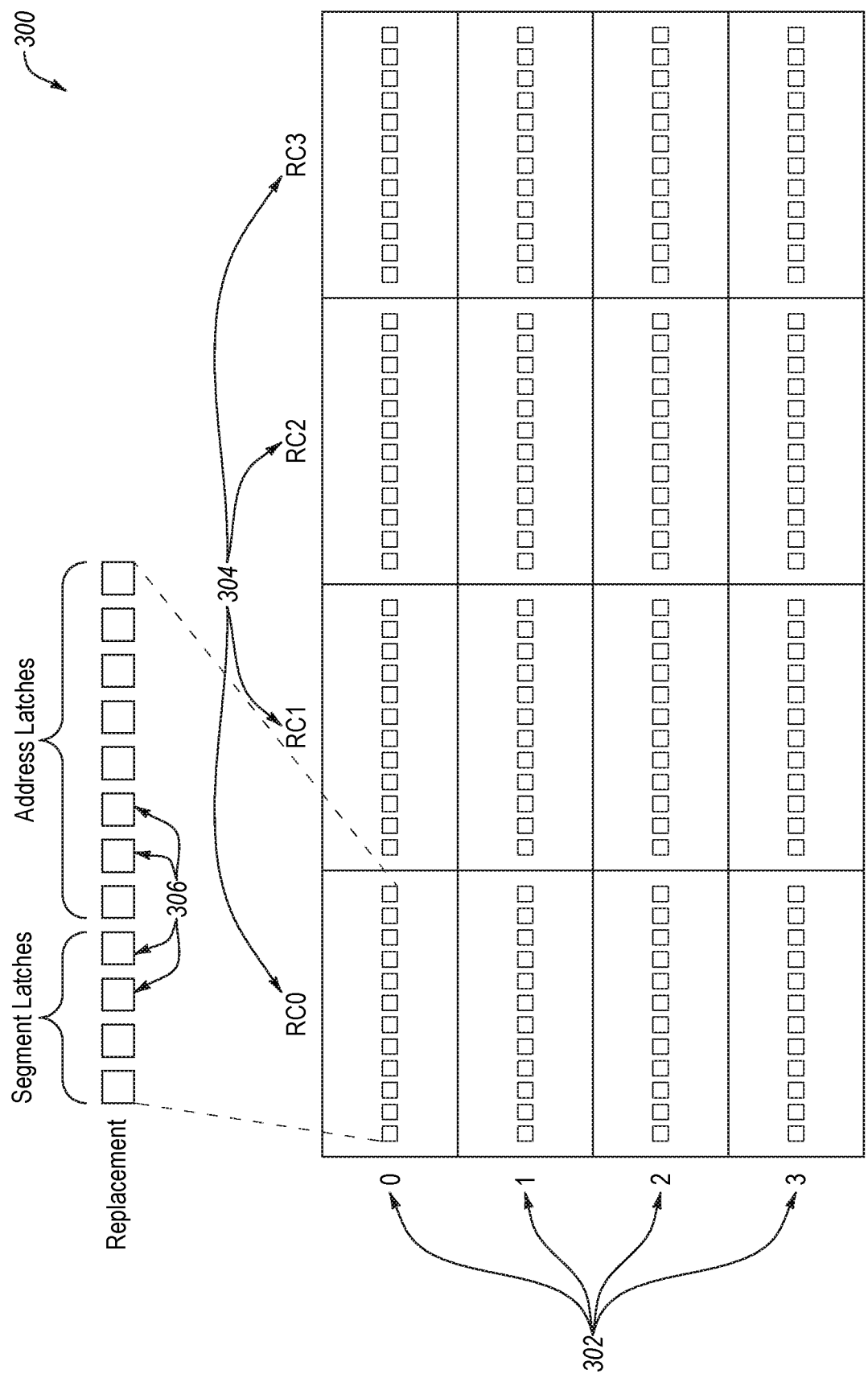
FIG. 3 is a diagram illustrating an array of latches, in accordance with at least one embodiment of the present disclosure.

FIG. 3 is a diagram illustrating an array of latches 300, in accordance with at least one embodiment of the present disclosure. The array of latches 300 may be included in or accessed by the replacement circuit 174 of FIG. 1 in implementing replacements.

The array of latches 300 may include multiple sets of latches. Specifically, FIG. 3 illustrates 16 sets of latches arranged in 4 latch-array rows 302 and 4 latch-array columns 304. The latch-array rows 302 of the array of latches 300 may or may not correspond to the rows or columns of the memory array. The latch-array columns 304 of the array of latches 300 may correspond to redundant columns of a column plane (e.g., redundant columns 208, RC0-RC3, of FIG. 2) of a memory array. A memory device of the present disclosure may include any number of sets of latches (e.g., any number of latch-array rows 302 and/or latch-array columns 304). The array of latches 300 may be associated with an array of fuses e.g., each of the latches 306 of each set of latches of the array of latches 300 may latch a state of a corresponding fuse of a corresponding set of fuses of the group of fuses.

Each set of latches may correspond to a potential repair. More specifically, each set of latches may be configured to indicate a replacement of one memory segment (e.g., column segment) with a redundant memory segment (e.g., a redundant column segment). In particular, a set of latches may be configured to identify a defective memory-cell group and a redundant memory-cell group that is to be accessed instead of the defective memory-cell group. The set of latches may be used by and/or included in a replacement circuit (e.g., replacement circuit 174 of FIG. 1) to identify and/or implement repairs.

Each set of latches of the array of latches 300 may include a number of latches allocated to indicate a memory segment (e.g., a column segment). In the present disclosure, the latches allocated to indicate a memory segment may be referred to as "segment latches." Additionally, each set of latches of the array of latches 300 may include a number of latches allocated to indicate one or more defective memory cells within the memory segment (e.g., a column within the column plane). In the present disclosure, the latches allocated to indicate the one or more defective memory cells may be referred to as "address latches."

Each of the latches 306 may latch a binary state. The states of the latches 306 may be interpreted as either a "1" or a "0." Thus, each set of latches (and/or the segment latches and/or address latches thereof) may be interpreted as a number. For example, a set of latches may include segment latches that latch states of "high," "low," "high," which may correspond to state of a set of fuses (e.g., having states of "blown," "unblown," "blown"). Thus the segment latches may be interpreted as "101" which may be interpreted as the number "5." Further, the segment latches of each set of latches may be interpreted to indicate a memory segment. And, the address latches of each set of latches may be interpreted to indicate a memory cell (or group of memory cells). Continuing the example from above, the "high," "low," "high" set of segment latches may be interpreted to indicate the "5th" memory segment (e.g., Seg4 of FIG. 2).

Referring again to FIG. 2, as an example, the address latches may be configured to indicate a column of the column plane 202 and the segment latches may be configured to indicate a column segment of the column segments 210 (e.g., a range of rows) of the column of the column plane 202.

Accordingly, the number of address latches of a set of latches may be related to the number of columns of the column plane 202, such that each column may be identifiable by a configuration of address latches. For example, the number of columns in the column plane 202 may be 2 to the power of the number of address latches in a set of latches (or fewer). As a specific example, a column plane 202 including 256 (e.g., $2^8$) (or fewer) columns may correspond to a set of latches including 8 address latches. In some embodiments, the number of address latches in a set of latches may be based on the number of columns in a column plane. Alternatively, in other embodiments, the number of columns in a column plane may be based on the number of address latches in a set of latches.

Additionally, the number of segment latches may be related to the number of column segments 210, such that each column segment may be identifiable by a configuration of segment latches. For example, the number of column segments 210 may be less than or equal to 2 to the power of number of segment latches less 2 (e.g., if there are n segment latches, there may be $2^n-2$ or fewer column segments). As a specific example, a column plane 202 segmented into 14 (e.g., $2^4-2$) (or fewer) column segments 210 may correspond to a set of latches including 4 segment latches. In some embodiments, the number of column segments into which rows of a column plane 202 are divided may be based on a number of segment latches of a set of latches. Alternatively, in other embodiments, the number of segment latches in a set of latches may be based on the number of column segments 210 of a column plane 202.

Accordingly, a defective memory-cell group may be indicated by a set of fuses. For example, segment latches of the set of latches may indicate the memory segment (e.g., range of rows) including a defective memory cell and address latches of the set of latches may indicate one or more memory cells within the memory segment (e.g., a column).

Additionally, each set of fuses may indicate a redundant memory-cell group which is to be accessed instead of the defective memory-cell group. Specifically, the segment latches may indicate a memory segment (e.g., a range of rows) to be accessed instead of the defective memory-cell group. Additionally, with reference again to FIG. 3, the placement of the set of latches within the array of latches 300 may indicate which redundant column of the column plane is to be accessed instead of the defective memory-cell group. For example, the array of latches 300 includes four latch-array columns 304 corresponding to replacement columns of a column plane. As such, a set of latches in the RC0 latch-array columns 304 indicates that the redundant memory-cell group will be from the corresponding RC0 redundant column of the column plane. As mentioned above, the redundant columns 208 may or may not be on the same column plane as the columns replaced thereby.

Notably, the number of latch-array rows 302 of the array of latches 300 may or may not correspond to a number of rows or column segments of a memory array. Specifically, as described above, there may be redundant columns available for repairs in each column segment such that the number of possible repairs is the number of redundant columns per column plane multiplied by the number of column segments. However, there may be fewer sets of latches in the array of latches 300 than the total number of possible repairs. In some embodiments, the total number of sets of latches may be based on failure rates of memory cells of the memory array. Having fewer sets of latches than possible repairs may save space on a memory device compared to a memory device that includes a set of latches for each possible repair.

As described above, the number of memory segments may be two or more fewer than two to the power of the number of segment latches. This may allow for two or more configurations of segment latches that do not indicate a memory segment. The two or more configurations may indicate that a set of latches does not indicate a repair. In other words, a replacement circuit may be configured to not make any replacement based on the two or more configurations. For example, when the replacement circuit (e.g., replacement circuit 174 of FIG. 1) compares an incoming operation address to a set of latches having one of the two or more configurations, the comparison may indicate there is no match, so no replacement is to be made based on that set of latches.

As a specific example, Table 1 illustrates an example of associations between configurations of segment latches and memory segments.

Table 1

| Segment-Latch Configuration | Memory Segment or Status | Corresponding Rows |
| --- | --- | --- |
| 000 | Disabled | None |
| 001 | Seg0 | R0-R1/6-1 |
| 010 | Seg1 | R1/6-2R1/6-1 |
| 011 | Seg2 | 2R1/6-3R1/6-1 |
| 100 | Seg3 | 3R1/6-4R1/6-1 |
| 101 | Seg4 | 4R1/6-5R1/6-1 |
| 110 | Seg5 | 5R1/6-R1-1 |
| 111 | Disabled | None |

For example, Table 1 illustrates that a set of segment latches having states of "low," "low," "high" which may be interpreted as 001, may correspond to a memory segment "Seg0."

The example associations illustrated in Table 1 includes two configurations of segment latches that do not correspond to a memory segment (i.e., 000 and 111). A set of latches including segment latches in one of these configurations may indicate that the set of latches does not indicate a repair. In other words, a replacement circuit may be configured to not make any replacement based on a set of latches including segment latches in one of the two configurations. As an example of how this may be accomplished, a replacement circuit (e.g., replacement circuit 174 of FIG. 1) may receive an operation address including a row address. The row address may be mapped to a column segment (e.g., according to the correspondence illustrated in Table 1). The column segment may be associated with a configuration of latches (e.g., according to the correspondence illustrated in Table 1). There may be no column segment associated with at least two configurations of latches (e.g., 000 and 111 as illustrated above). Thus, no operation address will be associated with the at least two configurations of latches. Thus, any set of latches having segment latches that match one of the at least two configurations of segment latches will not match with an incoming operation address. In this way, any set of latches having one of the at least two configurations of segment latches will not indicate a repair.

As described above, the states of the latches may correspond to states of fuses. In some cases, the states of the fuses may be irreversible once changed from an initial state (e.g., "unblown") to a final state (e.g., "blown").

Segment latches interpretable as all zeros (e.g., 000) (which may be referred to as the "all-zeros segment-latch configuration") may correspond to fuses in an initial state and may indicate that a set of latches does not indicate a repair. This may be advantageous because it may cause sets of latches to be interpreted, initially, as not indicating a repair. Thus, until a set of latches has been configured to indicate a repair (e.g., by blowing fuses corresponding to segment latches), the segment latches will indicate that the set of latches does not indicate a repair. In the present disclosure, sets of latches that do not indicate a repair (e.g., because they have not been configured to indicate a repair) may be referred to as "inactive," "disabled," or "unused." "Inactive," "disabled," or "unused" are examples of "statuses" of the set of latches. Thus, a configuration of segment latches of a set of latches may be indicative of a status of the set of latches.

One additional advantage of having the all-zeros segment-latch configuration not indicate a repair is that segment latches starting in the all-zeros segment-latch configuration can be configured into any other configuration, i.e., to indicate any other segment. Specifically, it is possible to blow fuses starting from the all-zeros segment-latch configuration to reach any other configuration. Because blowing fuses may be irreversible, it may not be possible to reach the all-zeros segment-latch configuration from any other state.

Segment latches interpretable as all ones (e.g., 111) (which may be referred to as the "all-ones segment-latch configuration") may correspond to fuses in a final state and may indicate that a set of latches does not indicate a repair. In the present disclosure, sets of latches that do not indicate a repair (e.g., because they have been configured to not indicate a repair) may be referred to as "inactive," "disabled," or "decommissioned." "Disabled" and "decommissioned" are two additional examples of "statuses" of a set of latches.

One advantage of having the all-ones segment-latch configuration not indicate a repair is that segment latches in any configuration can be configured to be in the all-ones segment-latch configuration. Specifically, it is possible to blow fuses starting from any other configuration to reach the all-ones segment-latch configuration.

As an example of a case in which having an all-ones segment-latch configuration not indicate a repair may be useful, during production of a memory device, a defect may be discovered in a column segment of a column. A set of latches may be configured to indicate a redundant column segment of a redundant column to be accessed instead of the column. During a subsequent test, a defect may be discovered in the redundant column. The set of latches may then be configured to not indicate a repair. Thus, the ability to configure a set of latches (and fuses) from an initial state that does not indicate a repair, to a second state that does indicate a repair and then to a third state that does not indicate a repair may be useful.

In some embodiments, additional configurations may also indicate no repairs. For example, a memory device configured with 12 column segments may include 4 segment latches. This may allow for 4 segment-latch configurations that do not indicate a repair (e.g., 0000, 1101, 1110, and 1111). In such a case, it may be advantageous to configure a set of segment latches to a state other than the all-ones segment-latch configuration that still indicates no repair. For example, it may be advantageous to configure segment latches configured as 0101 to 1101 thus saving blowing one fuse compared with configuring 0101 to 1111.

Some configurations of segment latches interpretable as including ones and zeros (e.g., 101) may correspond to sets of fuses in which some of the fuses are in the initial state and some of the fuses are in the final states and may indicate that a set of latches indicates a repair. For example, as described above, the segment latches including ones and zeros may indicate a memory segment for the repair. Thus, segment latches may be configurable to indicate either a memory segment or a status of the set of latches (e.g., as not indicating a repair (e.g., as "inactive," "disabled," "unused," "disabled," or "decommissioned")).

Segment latches (of a set of latches) that indicate a memory segment may be interpretable as an indication of the status of the set of latches. For example, when segment latches indicate a memory segment, the segment latches may be interpreted as an indication of a memory segment and an indication of that the set of latches are not "inactive," "disabled," "unused," disabled," or "decommissioned." However, this should not be understood as to conflict with the statement that segment latches may be configurable to indicate either a memory segment or a status of the set of latches. As a specific non-limiting example, a set of latches may include segment latches configured in the all-zeros segment-latch configuration. The segment latches may indicate a status of the set of latches and not indicate a memory segment, i.e., the set of latches may indicate that the set of latches is "inactive," "disabled," or "unused" and the segment latches may not indicate a memory segment. As another specific non-limiting example, a set of latches may include segment latches configured to be interpretable as ones and zeros (e.g., 101). The segment latches may indicate a memory segment (e.g., Seg4) and not indicate a status of the set of latches, i.e., the set of latches may indicate the memory segment and not indicate that the set of latches has a status of "inactive," "disabled," or "unused."

Figure 4:
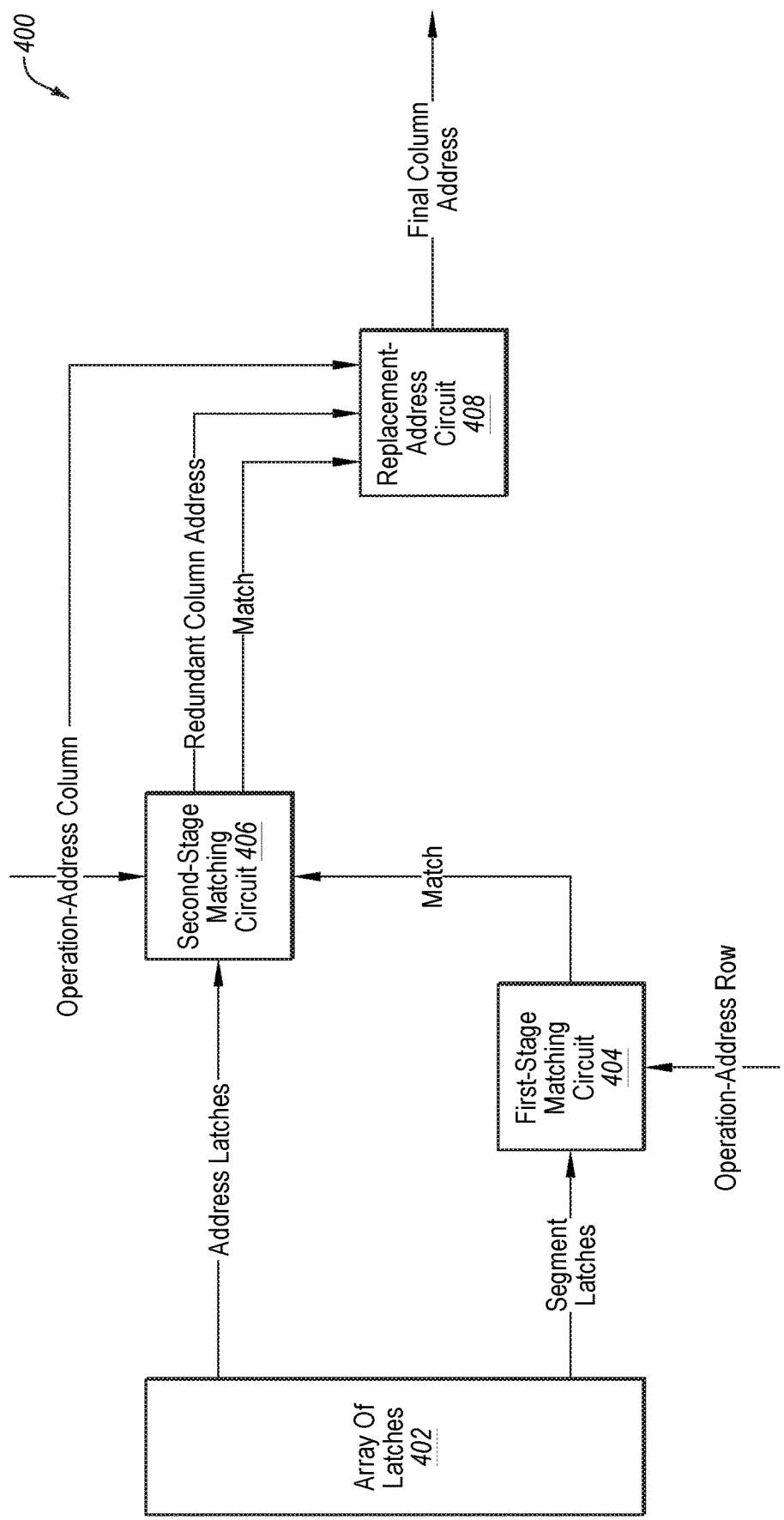
FIG. 4 is a functional block diagram of a replacement circuit, in accordance with at least one embodiment of the present disclosure.

FIG. 4 is a functional block diagram of a replacement circuit 400, in accordance with at least one embodiment of the present disclosure. The replacement circuit 400 may be one example of the replacement circuit 174 of FIG. 1. The replacement circuit 400 may include an array of latches 402, a first-stage matching circuit 404, a second-stage matching circuit 406, and a replacement-address circuit 408. The array of latches 402 may include segment latches and address latches. The array of latches 402 may be an example of the array of latches 300 of FIG. 3.

The first-stage matching circuit 404 may be configured to determine whether there is a repair in a column segment including an operation-address row. For example, the first-stage matching circuit 404 may receive the operation-address row and compare the operation-address row to rows of column segments including repairs as indicated by segment latches of the array of latches 402. For example, a comparison may be made between the operation-address row and row ranges of column segments including repairs (e.g., as found in a table analogous to Table 1).

If the first-stage matching circuit 404 determines that there is a match between the operation-address row and a row range of a column segment including a repair, the first-stage matching circuit 404 may provide a signal indicating a match to the second-stage matching circuit 406. In some embodiments, the signal indicating the match may additionally or alternatively indicate the column segment that matched the operation-address row. If the first-stage matching circuit 404 determines that there is not a match between the operation-address row and any of the segment latches indicating repairs, the first-stage matching circuit 404 may provide a signal indicating that there is no match to the second-stage matching circuit 406.

In some cases, segment latches may be configured to not match any operation-address row. For example, a set of segment latches that has not been configured to indicate a repair may include segment latches that are configured such that they will not match any incoming operation-address row. For example, Table 1 indicates that segment latches configured to a state 000 do not correspond to any rows and thus no incoming operation-address row will match a set of segment latches in this configuration. As another example, a set of segment latches that has been configured to indicate that the set of segment latches is disabled may include segment latches that are configured such that they will not match any incoming operation-address row. For example, Table 1 indicates that segment latches configured to a state 111 do not correspond to any rows and thus no incoming operation-address row will ever match a set of segment latches in this configuration. By providing for configurations of segment latches that do not indicate a repair, the need for an enable fuse and/or latch is obviated.

As an example of how a comparison between an operation-address row and segment latches may be performed, the operation-address row may be translated into a format suitable for comparison to the segment latches. For example, an intermediate column segment may be determined based operation-address row. Further, the intermediate column segment may be encoded to match a format of the segment latches. Also, the encoded intermediate column segment may be compared to the segment latches. One or more of these comparisons and/or determinations may be performed using circuitry, such as, for example, XOR complementary metal-oxide semiconductor (CMOS) logic and/or a dynamic pullup or pulldown match circuit.

The second-stage matching circuit 406 may be configured to determine whether there is a repair in an operation-address column. For example, the second-stage matching circuit 406 may receive the operation-address column and compare the operation-address column to columns including repairs as indicated by address latches of the array of latches 402. The second-stage matching circuit 406 may be configured to only make such a comparison when the first-stage matching circuit 404 has indicated a match. Further, in some embodiments, the second-stage matching circuit 406 may be configured to perform the comparison based on the match signal from the first-stage matching circuit 404. For example, the second-stage matching circuit 406 may compare a particular set of latches to the operation-address column based on an identification in the match signal of the particular set of latches. For example, the particular set of latches may be address latches corresponding to the segment latches that matched the operation-address row in the first-stage matching circuit 404.

If there is a match between the operation-address column and a repair (as indicated by a match between address latches and the operation-address column) and a match between the operation-address row and the repair (as indicated by a match between segment latches and the operation-address row), the second-stage matching circuit 406 may be configured to provide an additional matching signal that may indicate whether the operation-address column matched a repair. Further, in some embodiments, the second-stage matching circuit 406 may be configured to provide a redundant column address indicative of which redundant column address matched the operation-address column. The comparison between the operation-address column and the address latches at the second-stage matching circuit 406 may be similar to what was described above with regard to the comparison performed at the first-stage matching circuit 404.

The replacement-address circuit 408 may be configured to provide a final column address instead of the operation address, e.g., in response to receiving a redundant column address (and, in some embodiments, the additional matching signal) from a second-stage matching circuit. For example, the replacement-address circuit 408 may receive the redundant column address from the second-stage matching circuit 406 and provide the redundant column address as the final column address output instead of the operation-address column.

In some embodiments, one or both of the first-stage matching circuit 404 and the second-stage matching circuit 406 may be configured to output a match, or no-match regardless of the input. For example, one or both of the first-stage matching circuit 404 and the second-stage matching circuit 406 may include one or more additional inputs that may force one or both of the first-stage matching circuit 404 and the second-stage matching circuit 406 to output a match or no-match. This may be useful e.g., to avoid contention, when multiple rows of the same bank are addressed at the same time or in quick succession, e.g., during a refresh.

Figure 5:
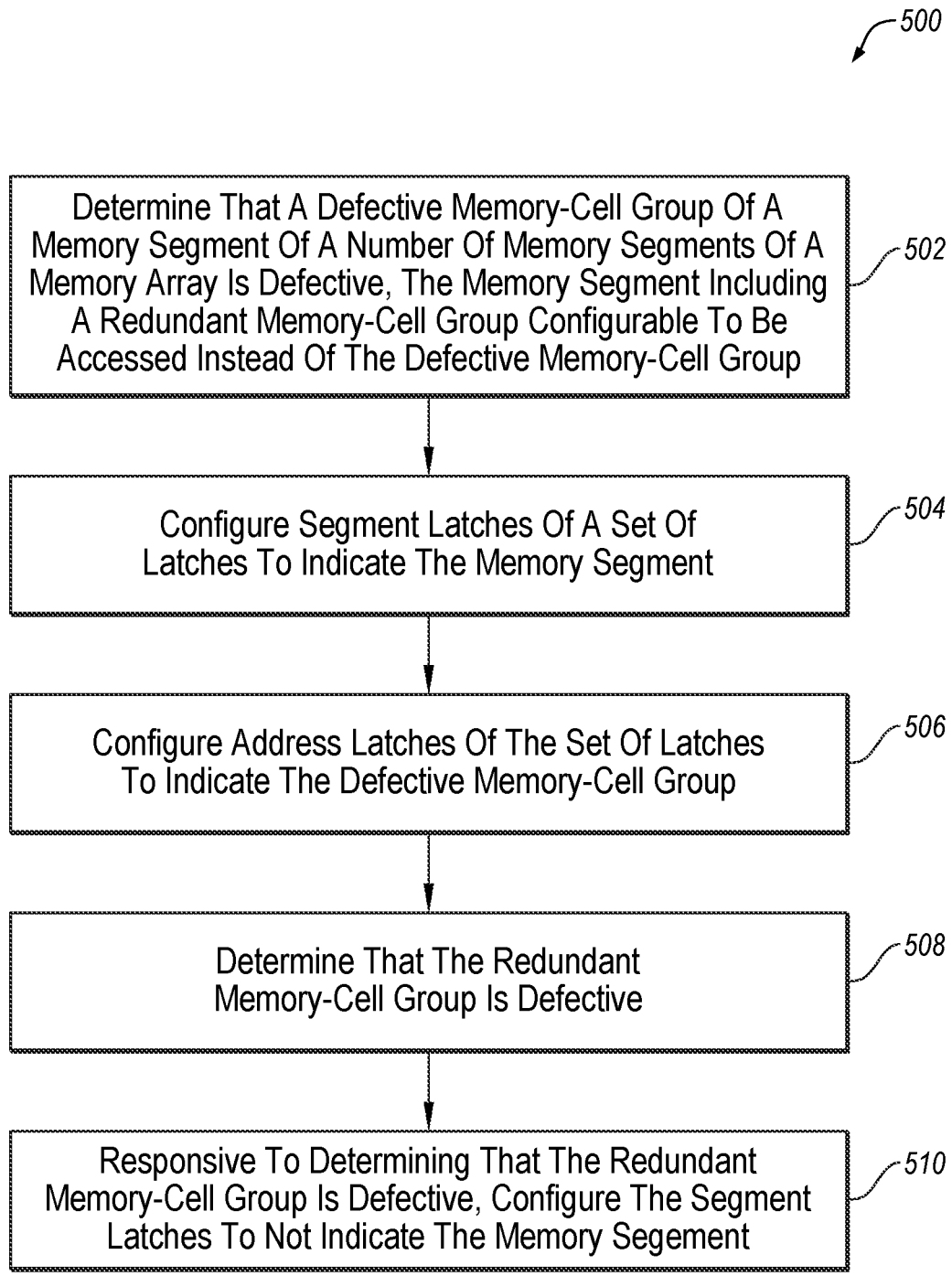
FIG. 5 is a flowchart illustrating an example method in accordance with at least one embodiment of the present disclosure.

FIG. 5 is a flowchart illustrating an example method 500, in accordance with at least one embodiment of the present disclosure. The method 500 may be performed during and/or as part of production of a memory device (e.g., the memory device 100 of FIG. 1). In particular, the method 500 may be performed on a memory devices to repair defective memory cells of the memory device. The method 500, if included as part of a manufacturing process, may improve yield of the manufacturing process.

At block 502, it may be determined that a defective memory-cell group of a memory segment of a number of memory segments of a memory array is defective. The memory segment may include a redundant memory-cell group configurable to be accessed instead of the defective memory-cell group. The operation at block 502 may include or follow a test of one or more memory cells of the memory array.

At block 504, segment latches of a set of latches may be configured to indicate the memory segment. For example, segment latches that may initially be interpreted as 0000, may be configured to be interpreted as an indicator of a column segment e.g., 1010 (e.g., by blowing corresponding fuses).

At block 506, address latches of the set of latches may be configured to indicate the defective memory-cell group. For example, address latches may by be configured to be interpreted as an indicator of a column (e.g., by blowing corresponding fuses).

As described above, the results of the operations of block 504 and block 506 may be that the redundant memory-cell group is configured to be accessed instead of the defective memory-cell group. For example, as described above, a replacement circuit may be configured to cause operations addressed to access the defective memory-cell group to instead access the redundant memory-cell group.

At block 508, it may be determined that the redundant memory-cell group is defective. The operation at block 508 may include or follow a test of one or more memory cells of the memory array.

In some embodiments, it may be determined that the redundant memory-cell group is defective after configuring the segment latches. For example, following the operations of block 504 and block 506, the redundant memory-cell group may be tested to determine whether the redundant memory-cell group is defective. Such testing may test the effectiveness of the repair implemented at the block 504 and the block 506.

Additionally or alternatively, after the operations of block 504 and block 506, a subsequent test may cause an operation to be addressed to access the defective memory-cell group. As a result of the operations of block 504 and block 506 (e.g., based on the segment latches and address latches), a replacement circuit may cause the redundant memory-cell group to be accessed instead of the defective memory-cell group. Accordingly, the subsequent test may test the redundant memory-cell group.

At block 510, responsive to determining that the redundant memory-cell group is defective, the segment latches may be configured to not indicate the memory segment. For example, segment latches that may be interpreted as an indicator of a column segment, e.g., 1010, may be configured to not indicate a column segment (e.g., by blowing corresponding fuses). There may be one or more configurations of segment latches that do not indicate a column segment and the segment latches may be configured into one of the one or more configurations, e.g., 1111.

Modifications, additions, or omissions may be made to method 500 without departing from the scope of the present disclosure. For example, the operations of method 500 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

FIG. 6 is a simplified block diagram illustrating a memory system 600 implemented in accordance with at least one embodiment of the present disclosure. Memory system 600, which may include, for example, a semiconductor device, includes a number of memory devices 602 and a controller 604. Controller 604 may be operatively coupled with memory devices 602 so as to convey command/address signals (e.g., command/address signals received by the command terminals 112 and/or the address terminals 110 of FIG. 1) to the memory devices 602.

The memory system 600 may include a replacement circuit (e.g., the replacement circuit 174 and/or the replacement circuit 400). Additionally or alternatively, the memory system 600 may be configured to implement one or more of the methods (e.g., method 500) described in the present disclosure.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 7 is a simplified block diagram illustrating an electronic system 700 implemented in accordance with at least one embodiment of the present disclosure. Electronic system 700 includes at least one input device 702, which may include, for example, a keyboard, a mouse, or a touch screen. Electronic system 700 further includes at least one output device 704, such as a monitor, a touch screen, or a speaker. Input device 702 and output device 704 are not necessarily separable from one another. Electronic system 700 further includes a storage device 706. Input device 702, output device 704, and storage device 706 may be coupled to a processor 708. Electronic system 700 further includes a memory device 710 coupled to processor 708. Memory device 710 may include at least a portion of memory system 600 of FIG. 6. Electronic system 700 may include, for example, a computing, processing, industrial, or consumer product. For example, without limitation, electronic system 700 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Some embodiments of the present disclosure include memory devices. One memory device may include a memory array including a number of memory cells partitioned into a number of memory segments. Each of the number of memory segments may include a redundant memory-cell group configurable to be accessed instead of a defective memory-cell group of the memory segment. The memory device may also include a set of latches configurable to indicate that a redundant memory-cell group of a memory segment of the number of memory segments is to be accessed instead of a defective memory-cell group of the memory segment. The set of latches may include segment latches configurable to indicate either the memory segment or a status of the set of latches. The set of latches may also include address latches configurable to indicate the defective memory-cell group within the memory segment.

Another memory device may include a memory array including a number of memory cells partitioned into a number of memory segments. Each of the number of memory segments may include a redundant memory-cell group configurable to be accessed instead of a defective memory-cell group of the memory segment. The memory device may also include a number of sets of latches each of the number of sets of latches configurable to indicate that a redundant memory-cell group of a memory segment of the number of memory segments is to be accessed instead of a defective memory-cell group of the memory segment. Each of the number of set of latches may include segment latches configurable to indicate a memory segment and address latches configurable to indicate the defective memory-cell group within the memory segment. The number of sets of latches may include: an unused set of latches, an active set of latches, and a decommissioned set of latches. The unused set of latches may include unused segment latches configured to not indicate a memory segment of the number of memory segments. The active set of latches may include active segment latches configured to indicate a memory segment of the number of memory segments that includes a defective memory-cell group to be replaced by a redundant memory-cell group. The decommissioned set of latches may include decommissioned segment latches configured to not indicate a memory segment of the number of memory segments.

Some embodiments of the present disclosure may include methods, e.g., methods of producing, testing, improving, and/or repairing memory devices. One method may include determining that a defective memory-cell group of a memory segment of a number of memory segments of a memory array is defective. The memory segment may include a redundant memory-cell group configurable to be accessed instead of the defective memory-cell group. The method may also include configuring segment latches of a set of latches to indicate the memory segment. The method may also include configuring address latches of the set of latches to indicate the defective memory-cell group. The method may also include, after configuring the segment latches, determining that the redundant memory-cell group is defective. The method may also include, responsive to determining that the redundant memory-cell group is defective, configuring the segment latches to not indicate the memory segment.

Additional methods may of the present disclosure include methods of operating a memory device. One such method may include receiving, at a matching circuit, an operation address. The method may also include determining whether a first portion of the operation address corresponds to a defective memory segment based on a comparison between the first portion and segment latches of a set of latches. The method may also include, responsive to determining that the first portion of the operation address corresponds to a defective memory segment, determining whether the operation address corresponds to a defective address of a defective memory-cell group based on a comparison between a second portion of the operation address and address latches of the set of latches. The method may also include, responsive to determining that the operation address corresponds to a defective address, providing a repair address of a redundant memory-cell group.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
a memory array including a number of memory cells partitioned into a number of memory segments, each of the number of memory segments including a redundant memory-cell group configurable to be accessed instead of a defective memory-cell group of the memory segment; and
a set of latches configurable to indicate that a redundant memory-cell group of a memory segment of the number of memory segments is to be accessed instead of a defective memory-cell group of the memory segment, the set of latches including:
segment latches configurable to indicate one of the memory segments or a status of the set of latches; and
address latches configurable to indicate the defective memory-cell group within the memory segment.

2. The device of claim 1, wherein each of the number of memory segments is identifiable by a corresponding configuration of segment latches and none of the number of memory segments is identifiable by a configuration of segment latches in which all of the segment latches have a same state.

3. The device of claim 1, wherein the set of latches includes n segment latches, n is an integer equal to or greater than two, and the memory array includes at most $2^n-2$ memory segments.

4. The device of claim 1, wherein when each of the segment latches has a same state, the segment latches indicate that the set of latches is inactive.

5. The device of claim 1, wherein each of the segment latches is initially configured to have an initial state and wherein the segment latches are configurable to indicate the memory segment in response to identifying the defective memory-cell group of the memory segment as defective.

6. The device of claim 5, wherein the initial state of each of the segment latches corresponds to an initial state of a corresponding fuse.

7. The device of claim 1, wherein the segment latches are configurable to each have a final state in response to identifying the redundant memory-cell group of the memory segment as defective.

8. The device of claim 7, wherein the final state of each of the segment latches corresponds to a final state of a corresponding fuse.

9. The device of claim 1, wherein the set of latches does not include an enable fuse latch.

10. The device of claim 1, further comprising a first-stage matching circuit configured to determine whether a first portion of an operation address corresponds to the memory segment based on a comparison between the first portion and the segment latches.

11. The device of claim 10, further comprising a second-stage matching circuit configured to determine whether the operation address corresponds to a defective address of the defective memory-cell group based on: a comparison between a second portion of the operation address and the address latches; and the determination of whether the first portion corresponds to the memory segment.

12. The device of claim 1, further comprising a replacement circuit configured to provide a redundant address of the redundant memory-cell group instead of a defective address of the defective memory-cell group in response to receiving an operation address corresponding to the defective memory-cell group.

13. A system, comprising:
an input device;
an output device;
a processor device operably coupled to the input device and the output device; and
a memory device operably coupled to the processor device, the memory device comprising:
a number of memory cells partitioned into a number of memory segments, each of the number of memory segments including a redundant memory-cell group configurable to be replace a defective memory-cell group of the memory segment; and
a number of sets of latches, each of the number of sets of latches configurable to indicate that a redundant memory-cell group of a memory segment of the number of memory segments is to replace a defective memory-cell group of the memory segment, each of the number of sets of latches including segment latches configurable to indicate a memory segment and address latches configurable to indicate the defective memory-cell group within the memory segment, the number of sets of latches including:
an unused set of latches including unused segment latches configured to not indicate a memory segment of the number of memory segments;
an active set of latches including active segment latches configured to indicate a memory segment of the number of memory segments that includes a defective memory-cell group to be replaced by a redundant memory-cell group; and
a decommissioned set of latches including decommissioned segment latches configured to not indicate a memory segment of the number of memory segments.

14. The system of claim 13, wherein a state of each of the unused segment latches corresponds to an initial state of a corresponding set of fuses.

15. The system of claim 13, wherein a first state of a first subset of the active segment latches corresponds to an initial state of a corresponding set of fuses and a second state of a second subset of the active segment latches corresponds to a final state of the corresponding set of fuses.

16. The system of claim 13, wherein a state of each of the decommissioned segment latches corresponds to a final state of a corresponding set of fuses.

17. A method, comprising:
determining that a defective memory-cell group of a memory segment of a number of memory segments of a memory array is defective, the memory segment including a redundant memory-cell group configurable to be accessed instead of the defective memory-cell group;
configuring segment latches of a set of latches from indicating a status of the set of latches to indicate the memory segment; and
configuring address latches of the set of latches to indicate the defective memory-cell group.

18. The method of claim 17, wherein prior to configuring the segment latches to indicate the memory segment, a state of each of the segment latches corresponds to an initial state of a corresponding fuse of a corresponding set of fuses.

19. The method of claim 17, wherein configuring the segment latches to indicate the memory segment comprises configuring a corresponding set of fuses by altering one or more fuses of the set of fuses.

20. The method of claim 17, wherein the method does not include configuring an enable latch.

21. The method of claim 17, further comprising:
    determining that the redundant memory-cell group is defective; and
    responsive to determining that the redundant memory-cell group is defective, configuring the segment latches to not indicate the memory segment.

22. The method of claim 21, wherein configuring the segment latches to not indicate the memory segment comprises configuring the segment latches to indicate that the set of latches is decommissioned.

23. The method of claim 22, wherein configuring the segment latches to indicate that the set of latches is decommissioned comprises configuring a corresponding set of fuses by altering one or more fuses of the set of fuses such that each fuse of the set of fuses is in a final state.

24. The method of claim 21, wherein the method does not include configuring an enable latch.

\* \* \* \* \*

UNITED STATES PATENT AND TRADEMARK OFFICE
CERTIFICATE OF CORRECTION

PATENT NO. : 11,114,181 B1
APPLICATION NO. : 16/983757
DATED : September 7, 2021
INVENTOR(S) : Christopher G. Wieduwilt et al.

Page 1 of 1

It is certified that error appears in the above-identified patent and that said Letters Patent is hereby corrected as shown below:

In the Specification

| | | |
|---|---|---|
| Column 3, | Line 25, | change "and/BL" to --and /BL-- |
| Column 3, | Line 29, | change "and/BL" to --and /BL-- |
| Column 3, | Line 35, | change "and/BL" to --and /BL-- |
| Column 3, | Line 36, | change "or/BL" to --or /BL-- |
| Column 3, | Line 45, | change "or/BL" to --or /BL-- |
| Column 4, | Line 31, | change "and/CK" to --and /CK-- |
| Column 6, | Line 3, | change "1/6" to --l/6-- |
| Column 8, | Line 56, | change "R1/6-1" to --Rl/6-1-- |
| Column 8, | Line 57, | change "R1/6-2R1/6-1" to --Rl/6-2Rl/6-1-- |
| Column 8, | Line 58, | change "2R1/6-3R1/6-1" to --2Rl/6-3Rl/6-1-- |
| Column 8, | Line 59, | change "3R1/6-4R1/6-1" to --3Rl/6-4Rl/6-1-- |
| Column 8, | Line 60, | change "4R1/6-5R1/6-1" to --4Rl/6-5Rl/6-1-- |
| Column 8, | Line 61, | change "5R1/6-R1-1" to --5Rl/6-Rl-1-- |

Signed and Sealed this
Second Day of November, 2021

Drew Hirshfeld
*Performing the Functions and Duties of the
Under Secretary of Commerce for Intellectual Property and
Director of the United States Patent and Trademark Office*